WIDE BAND REGENERATIVE FREQUENCY DIVIDER AND MULTIPLIER

Filed Dec. 30, 1957

INVENTOR.
EDWIN F. LAINE
BY
Roland A. Anderson
ATTORNEY.

United States Patent Office 2,913,670

Patented Nov. 17, 1959

2,913,670

WIDE BAND REGENERATIVE FREQUENCY DIVIDER AND MULTIPLIER

Edwin F. Laine, Danville, Calif., assignor to the United States of America as represented by the United States Atomic Energy Commission Application December 30, 1957, Serial No. 706,222

6 Claims. (Cl. 331—43)

Figure 2:
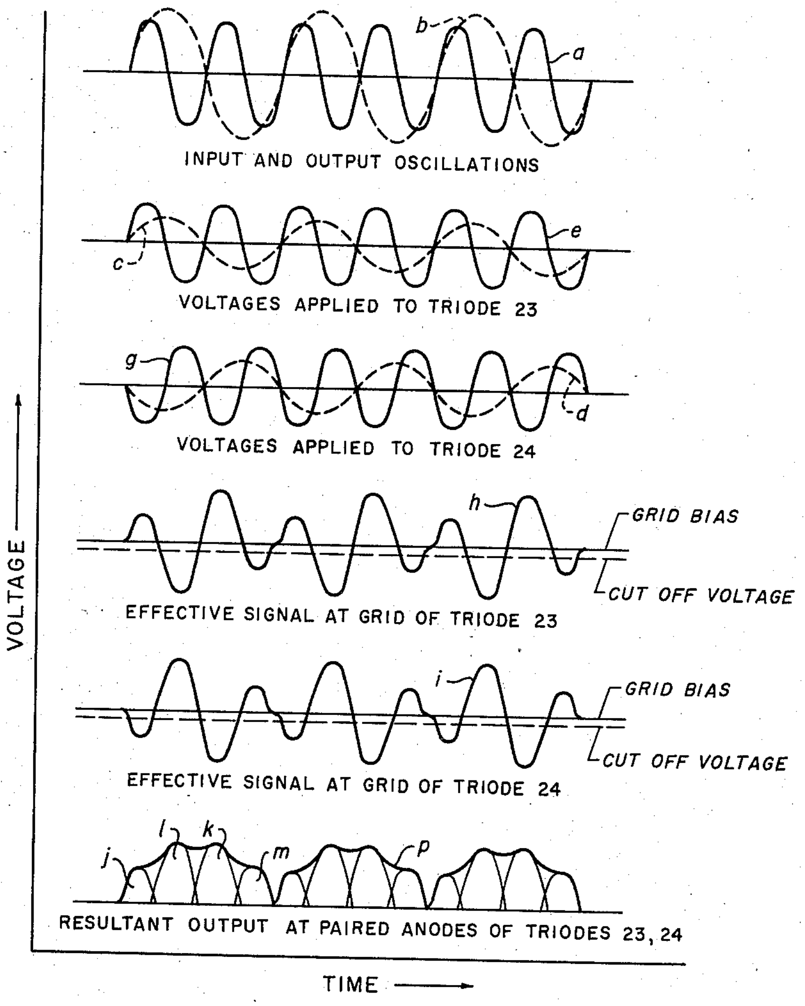

The present invention relates to frequency dividers and multipliers, in general, and more particularly to a wideband regenerative frequency divider and multiplier circuit.

It is often times desirable in electronics and related fields that oscillatory electrical energy be produced at a frequency which is an exact submultiple or multiple of the frequency of other oscillatory electrical energy. For example, in various electronics counting and control applications it is necessary to divide or multiply the frequency of a first oscillating energy wave by a given factor to derive a second oscillating energy wave having a frequency which is a known fraction or multiple of the first wave frequency.

Various relaxation oscillators, e.g., multivibrators and blocking oscillators, are particularly well adapted to frequency division and multiplication service inasmuch as such oscillators are readily synchronized at an exact subharmonic or harmonic of an injected signal frequency. Conventional regenerative frequency dividers and multipliers are also commonly employed to produce an output oscillatory signal at an exact submultiple or multiple frequency of an input signal frequency.

Frequency division and multiplication devices of the foregoing types, however, are inherently extremely narrow frequency band devices. Therefore, widely separated input signal frequencies produce output signal frequencies at different frequency ratios rather than a fixed ratio in the absence of appropriate circuit adjustment. Such conventional narrow band devices are consequently unsuited to many applications where the input signal frequency is variable over a wide range and it is impracticable or impossible to adjust the device to each frequency in the range to obtain a fixed division or multiplication ratio. One such application arises in nuclear research in conjunction with various variable frequency high energy particle accelerators where it is often times desirable that the energy of the accelerator beam be materially decreased prior to impingement upon a target which is incapable of dissipating the normal beam energy. In this connection, a wideband frequency division device may be advantageously employed to produce oscillations at a fixed subharmonic frequency of any one of the variable pulsed beam frequencies of the accelerator. The subharmonic oscillations are then applied to suitable beam extraction structure to synchronously derive beam pulses for bombarding the target, which pulses occur at the corresponding fraction of the accelerator variable beam frequency and accordingly comprise a pulsed beam of reduced energy.

The present invention provides a wideband regenerative frequency divider which produces output energy oscillations at a fixed subharmonic frequency of a wide range of input energy oscillation frequencies. In addition the device may be employed as a wide band frequency multiplier. The invention accordingly overcomes many of the limitations and inadequacies of conventional narrow band frequency dividers and multipliers and fulfills the requirements of the foregoing accelerator application, as well as other wideband applications in electronics, telephone work, radio, television, and the like. Moreover, the present invention possesses further advantages in that it is a "self-locking device," i.e., output oscillations are generated only in response to input oscillations.

Therefore, it is an object of the present invention to provide a regenerative frequency divider and multiplier which is capable of producing output oscillations having frequencies which are related by a fixed ratio to the frequencies of input oscillations over a wide band of input frequencies.

Another object of the invention is the provision of a wideband frequency divider and multiplier for producing sinusoidal output signals at fixed subharmonic and harmonic frequencies of a wide range of sinusoidal input signal frequencies.

It is a further object of the invention to provide a self-locking wideband regenerative frequency division and multiplication device.

Figure 1:
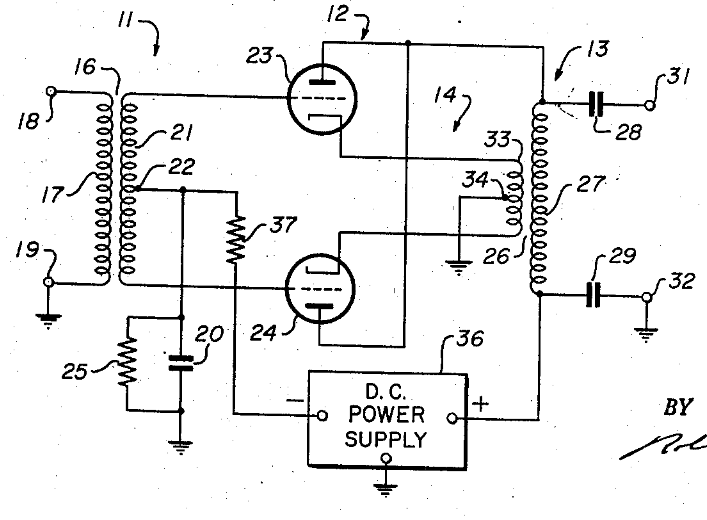

The invention both as to its organization and method of operation, together with further objects and advantages thereof, will be better understood by reference to the following specification taken in conjunction with the accompanying drawing, of which:

Figure 1 is a schematic circuit diagram of a preferred embodiment of the invention; and Figure 2 is a graphical illustration of various voltage wave shapes occurring in this embodiment under specific operating conditions.

Considering now the invention in some detail and referring to the illustrated form thereof in the drawing, there is provided a wideband regenerative frequency divider and multiplier which generally includes a wide band-pass input circuit 11 which is adapted to receive electrical oscillations over an extremely wide band of frequencies. The input oscillations are coupled by means of a mixer 12 to a wide band-pass output tank circuit 13 which is tuned to a band of frequencies related by a fixed frequency ratio to the pass band of input circuit 11. In the event the invention is to be used as a divider, the pass band of output circuit 13 is tuned to a fixed subharmonic or submultiple of the band pass frequencies of input circuit 11. Conversely, when the invention is utilized as a multiplier, the output circuit is tuned to a band of frequencies that are harmonically related by a fixed multiplying factor to the input circuit frequency band. A regenerative feedback circuit 14 coupled between output circuit 13 and mixer 12 applies a fixed frequency ratio feedback signal as derived from the output circuit to mixer 12 and with a 180° phase shift relative to the corresponding input oscillations. The fixed frequency ratio feedback signal of shifted phase is combined with the input oscillations in mixer 12 to thereby sustain the fixed frequency ratio output oscillations in output circuit 13.

More particularly, wideband input circuit 11 preferably comprises an air core transformer 16 having a primary winding 17 connected between conventional input terminals 18, 19, the latter one of which is connected to ground. The secondary winding 21 of transformer 16 is provided with a center tap 22 which is coupled to ground, preferably through a bypass condenser 20 in parallel with a bias resistor 25. A suitable oscillatory signal applied between input terminals 18, 19 accordingly induces oppositely phased voltages oscillating at the frequency of the input signal at the terminals of secondary winding 21 by virtue of the grounded center tap 22.

The terminals of secondary winding 21 are in turn coupled to mixer 12 which includes means for combining the oppositely phased voltages with the freedback signal of fixed frequency ratio which is derived as subsequently described. More particularly, mixer 12 includes a pair of suitable vacuum tubes which are preferably provided as triodes 23, 24 having their anodes commonly paired. The grids of triodes 23, 24 are respectively connected to the terminals of secondary winding 21 whereby the oppositely phased voltages appearing thereat are combined in triodes 23, 24 with the feedback signal of previous mention which is applied to the cathodes of such triodes in a manner which is subsequently described. In addition, the input interelectrode capacitance and other inherent operating characteristics such as trans-conductance of triodes 23, 24 in combination with the inductance of transformer 16 are selected to provide input circuit 11 with wide band-pass characteristics. In this regard, it will be appreciated that it is sometimes desirable that additional triodes be paralleled with triodes 23, 24 at their anodes, grids and cathodes, respectively, to provide resultant tube characteristics which yield a given desired input circuit band pass characteristic.

The paired anodes of mixer triodes 23, 24 are connected to output circuit 13. More particularly, output circuit 13 preferably includes an air core output transformer 26 having a primary tank winding 27 connected at one terminal to the paired anodes of triodes 23, 24. The terminals of tank winding 27 are in turn respectively coupled through blocking capacitors 28, 29 to conventional output terminals 31, 32, the latter one of which is connected to ground. The inductance of transformer 26 together with the output interelectrode capacitance and other operating characteristics of triodes 23, 24 provide output circuit 13 with relatively wide frequency band pass characteristics. Moreover, the values of the inductance and tube characteristics are selected such that the pass band frequencies of output circuit 13 are related to the frequencies within the pass band of input circuit 11 by a desired fixed frequency ratio greater or less than one, viz., a multiple or submultiple of the band of input frequencies.

The regenerative feedback means 14 of previous mention may best be provided as a secondary tickler winding 33 of output transformer 26 and having a center-tap 34 connected to ground. Oppositely phased voltages are produced at the terminals of tickler winding 33 by virtue of the grounded center tap 34 and, due to transformer action, such voltages are oscillating at the frequency of oscillation of output circuit 13, viz., a frequency which is a fixed ratio of the frequency of electrical oscillations applied to input circuit 11. The foregoing voltages are applied to mixer 12 preferably by connection of the tickler winding terminals to the cathodes of mixer triodes 23, 24, and accordingly such voltages comprise the feedback signal of previous mention. More particularlyl, the terminals of winding 33 are connected to the cathodes with regard to the polarity of the terminals such that the feedback signals at the cathodes of triodes 23, 24 are respectively phased 180° relative to the signals applied to their grids. The oscillations in output circuit 13 are accordingly sustained by the positive feedback action of feedback circuit 14.

Operating bias is provided at mixer triodes 23, 24 in a conventional manner as by means of a D.C. power supply 36 having a bi-polar output with respect to ground. The negative terminal of such power supply is coupled to the grids of triodes 23, 24, to bias same to a suitable grid operating bias slightly above cut-off, as through a voltage dropping resistor 37 connected between the negative power supply terminal and input transformer center-tap 22. Similarly, the positive terminal of power supply 36 is connected to one terminal of output transformer primary winding 27 to provide appropriate operating bias at the anodes of triodes 23, 24.

With the foregoing connections accomplished and the circuit constructed of conventional components and energized as hereinbefore described, input oscillations impressed across terminals 18, 19 and having a frequency, $f$, within the pass band of input circuit 11, will produce output oscillations between terminals 31, 32 at a frequency of exactly $f/n$, where $n$ is a factor greater or less than one.

The operation of the frequency divider and multiplier of the present invention can best be understood by consideration of a specific example, such as the case where $n=2$, and the circuit consequently functions as a binary frequency divider. Input oscillations, $a$, as shown in Figure 2 of the drawing and of a frequency, $f$, produce in-phase output oscillations, $b$, of a frequency $f/2$. The output oscillations, $b$, induce oppositely phased feedback voltages, $c$, $d$, respectively, of like frequency, $f/2$, at the terminals of output transformer tickler winding 33, and such feedback voltages are impressed at the cathodes of mixer triodes 23, 24, respectively. Moreover, feedback voltages $c$, $d$, are respectively in phase and 180° out-of-phase with respect to the output oscillations, $b$. Therefore, the feedback voltages $c$, $d$ when referred to the grids of triodes 23, 24 are each 180° out-of-phase with respect to oppositely phased voltages $e$, $g$ of frequency, $f$, applied to the grids of triodes 23, 24 from input transformer secondary winding 21 in response to the input oscillations, $a$, applied to input terminals 18, 19. The voltages $e$ and $g$ are accordingly respectively combined with feedback voltages $c$ and $d$ in 180° phase relationship to produce similar effective grid signals $h$ and $i$ at the grids of triodes 23, 24, respectively.

It is to be noted that signal $h$ is 180° out-of-phase with respect to signal $i$ and therefore the former signal undergoes positive half-cycle variations while the latter undergoes negative half-cycle variations and vice versa. The negative half-cycle variations of the effective grid signals $h$, $i$ are of sufficient proportions to drive the grids below cut-off, as indicated in Figure 2, such that during the negative variations the triodes 23, 24 are respectively rendered non-conducting while during the positive half-cycle variations of the effective grid signals, the triodes are respectively rendered conducting. Accordingly, unidirectional pulses $j$, $k$ are alternately produced at a repetition rate of $f/2$ at the anode of triode 23 during the conduction periods thereof. Similarly, unidirectional pulses $l$, $m$ are alternately produced at the anode of triode 24 during the conduction periods thereof, and such pulses $l$, $m$ are respectively displaced approximately 180° in phase from pulses $j$, $k$ with pulses $j$ and $k$ respectively partially overlapping pulses $l$ and $m$ in time. Since the anodes of triodes 23, 24 are paired and because of the inherent reactive characteristics of low Q circuits such as wide band-pass circuit 13 coupled to the paired anodes, each group of pulses $j$, $k$, $l$, $m$ are merged, thus forming a resultant output signal $p$ at the paired anodes. It will be noted that output signal $p$ comprises a series of unidirectional pulses occurring at a repetition rate of $f/2$. Such pulses therefore synchronize oscillations in output circuit 13 to the repetition rate, $f/2$, with the oscillations then appearing between output terminals 31, 32 as a sinusoidal signal having a frequency, $f/2$.

As regards the operation of the frequency divider of the present invention with no signal applied to input terminals 18, 19, it should be noted that the negative half-cycles of the feedback voltages applied to the cathodes of triodes 23, 24 are not of sufficient proportions alone to drive the triodes below cut-off. Thus alternating voltages having a relative 180° phase displacement are obtained at the anodes of triodes 23, 24 respectively, and since the anodes are commonly coupled to output transformer primary winding 27, the alternating voltages cancel each other resulting in no output at terminals 31, 32. The frequency divider of the present invention is consequently "self-locking" in that output oscillations are generated at terminals 31, 32 only in response to input oscillations impressed at terminals 18, 19.

While the present invention has been hereinbefore described with respect to but a single preferred embodiment, it will be apparent that numerous modifications and variations are possible within the spirit and scope of the invention and thus it is not intended to limit the invention except by the terms of the following claims.

What is claimed is:

1. A wide band regenerative frequency divider and multiplier circuit comprising at least one first and one second mixer vacuum tubes each having at least cathode, grid, and anode elements, means biasing said vacuum tubes with operating potential, a wide band-pass input circuit responsive to electrical input oscillations over a wide band of frequencies and coupled to the grids of said first and second mixer tubes respectively, said input circuit producing at said grids oppositely phased voltages oscillating at the frequency of an applied input oscillation, an output tank circuit tuned to a pass band of frequencies at a fixed ratio of the band pass frequencies of said input circuit, a regenerative feedback circuit coupled between said output circuit and the cathodes of said first and second mixer tubes respectively for producing at said cathodes oppositely phased feedback voltages at the frequency of the fixed ratio oscillations in said output circuit, and means commonly coupling the anodes of said first and second mixer tubes to said output circuit whereby oscillations are sustained therein at the fixed ratio frequency of said applied input oscillation.

2. A wide band regenerative frequency divider including the circuit defined by claim 1 further defined by said fixed ratio being a submultiple.

3. A wide band regenerative frequency multiplier including the circuit defined by claim 1 further defined by said fixed ratio being a multiple.

4. A wide band frequency divider and multiplier circuit comprising an input transformer having a primary winding and a secondary winding with a center-tap coupled to ground, input terminals coupled to the terminals of said primary winding, one of said terminals connected to ground, at least one first vacuum tube having at least cathode, grid and anode elements, said grid coupled to one terminal of said secondary winding, at least one second vacuum tube having at least cathode, grid, and anode elements, said grid coupled to the other terminal of said secondary winding, said transformer and first and second vacuum tubes forming a wide band-pass input circuit, an output transformer having a primary winding and a secondary tickler winding with a center-tap connected to ground, the terminals of said primary winding respectively commonly coupled to the anodes of said first and second vacuum tubes and to ground, the terminals of said secondary tickler winding respectively coupled to the cathodes of said first and second vacuum tubes, said output transformer and said first and second vacuum tubes forming a band-pass circuit tuned to a fixed ratio of the pass band of said input circuit, output terminals coupled to the terminals of the primary winding of said output transformer, and bias means coupled to said first and second vacuum tubes for biasing said anodes with operating potential and biasing said grids above cut-off.

5. A wide band frequency divider-multiplier comprising an input transformer having a primary winding and a secondary winding with a center-tap, input terminals connected to the terminals of said primary winding, one of said input terminals connected to ground, a capacitor connected between said center-tap and ground, a bias resistor connected in parallel with said capacitor, first and second triodes having their grids respectively connected to the terminals of said secondary winding, said transformer in combination with the inherent input properties of said first and second triodes forming a wide band-pass input circuit, an output transformer having a primary winding and a secondary winding with a center-tap connected to ground, the terminals of said secondary winding respectively connected to the cathodes of said first and second triodes, the first terminal of the primary winding of said output transformer commonly connected to the anodes of said first and second triodes, said output transformer in combination with the inherent output properties of said first and second triodes forming a band pass circuit tuned to fixed ratio frequencies of the pass band of said input circuit, a pair of output terminals, one of said output terminals connected to ground, a pair of blocking capacitors respectively connected between the terminals of the primary winding of said output transformer and said output terminals, a D.C. power supply having positive and negative terminals with respect to ground, said positive terminal connected to the second terminal of the primary winding of said output transformer, and a voltage dropping resistor connected between said negative terminal and the center tap of the secondary winding of said input transformer to bias the grids of said first and second triodes slightly above cut-off.

6. A wide band regenerative frequency divider and multiplier circuit comprising a wide band-pass input circuit responsive to electrical input oscillations over a wide band of frequencies for producing first and second oppositely phased voltages oscillating at the frequency of said input oscillations, an output tank circuit including a transformer having a primary winding and a secondary winding with a center-tap connected to ground, said tank circuit tuned to a pass band of frequencies bearing a fixed ratio relationship to the band pass frequencies of said input circuit, said secondary winding producing first and second oppositely phased feedback voltages respectively at its opposite ends in response to oscillations in said output circuit and at the fixed ratio frequency thereof, electronic mixer means coupled to said input circuit and the ends of said secondary winding for respectively combining in 180° phase relationship said first voltage with said first feedback voltage and said second voltage with said second feedback voltage to respectively produce first and second combination voltages, and means commonly coupling said first and second combination voltages from said mixer means to one terminal of said primary winding with the other terminal thereof being connected to ground to sustain oscillations in said output circuit at said fixed ratio frequency.

References Cited in the file of this patent

UNITED STATES PATENTS

| | | |
|---|---|---|
| 1,848,507 | Vos et al. | Mar. 8, 1932 |
| 1,878,308 | Hansell | Sept. 20, 1932 |
| 2,162,806 | Fay | June 20, 1939 |